(12) United States Patent
Kojima

(10) Patent No.: US 7,868,694 B2
(45) Date of Patent: Jan. 11, 2011

(54) VARIABLE RESISTOR ARRAY AND AMPLIFIER CIRCUIT

(75) Inventor: Takashi Kojima, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 65 days.

(21) Appl. No.: 12/404,818

(22) Filed: Mar. 16, 2009

(65) Prior Publication Data

US 2009/0243726 A1 Oct. 1, 2009

(30) Foreign Application Priority Data

Apr. 1, 2008 (JP) ............................. 2008-094768

(51) Int. Cl.
*H03F 1/36* (2006.01)
(52) U.S. Cl. ........................................ 330/86; 330/282
(58) Field of Classification Search .................... 330/86, 330/282
See application file for complete search history.

(56) References Cited

U.S. PATENT DOCUMENTS 6,621,346 B1 * 9/2003 Nabicht et al. ............... 330/282
6,825,718 B2 * 11/2004 Kang et al. .................... 330/86
7,423,482 B2 * 9/2008 Blon ............................ 330/86

FOREIGN PATENT DOCUMENTS

JP  A-11-017470  1/1999
JP  A-2007-258784  10/2007

* cited by examiner

*Primary Examiner*—Khanh V Nguyen
(74) *Attorney, Agent, or Firm*—Oliff & Berridge PLC

(57) ABSTRACT

A variable resistor array adapted to make a resistance value between a first terminal and a second terminal variable, includes a plurality of resistors connected in series, first through nth MOS transistors selectively connected to the resistors, and first through nth switches having one input terminal connected to the source of the ith MOS transistor, another input terminal connected to a predetermined voltage, and an output terminal connected to a back gate of the ith MOS transistor, and connecting either one of the one input terminal and the other input terminal to the output terminal under control of the ith control signal. The ith switch connects the other input terminal to the output terminal, and the ith switch also connects the one input terminal to the output terminal.

3 Claims, 4 Drawing Sheets

VARIABLE RESISTOR ARRAY AND AMPLIFIER CIRCUIT

BACKGROUND

1. Technical Field

The present invention relates to an amplifier circuit such as an inverting amplifier circuit, a variable resistor array used in the amplifier circuit and for adjusting the amplification degree (gain) and so on, and an electronic apparatus incorporating the amplifier circuit.

2. Related Art

In relation to a "switch for switching the amplitude of the gain of an inverted amplifier" described in JP-A-2007-258784, a variable resistor array $R_{VAR}$ in an amplifier circuit AMP shown in FIG. 4 is provided with a first NMOS transistor N1 and a second NMOS transistor N2 as shown in FIG. 5A in order for switching, for example, between a resistance value R1 of a resistor R1 and a combined resistance value (R1+R2) of a resistance value R1 of the resistor R1 and a resistance value R2 of a resistor R2.

The first and second NMOS transistors N1, N2 come into a conduction (ON) state or a cut-off (OFF) state exclusively, namely the second NMOS transistor N2 comes into the cut-off (OFF) state when the first NMOS transistor N1 is in the conduction (ON) state, and the second NMOS transistor N2 comes into the conduction (ON) state when the first NMOS transistor N1 is in the cut-off (OFF) state, for example.

As shown in FIG. 5B, the first NMOS transistor N1 can be represented in a equivalent manner with a first switch SW1 provided with an ON-resistor element Ron having a resistance value of Ron in the conduction (ON) state and an OFF-resistor element Roff having a resistance value of Roff in the cut-off (OFF) state. Similarly, as shown in FIG. 5B, the second NMOS transistor N2 can be represented in a equivalent manner with a second switch SW2 provided with the ON-resistor element Ron and the OFF-resistor element Roff.

In order for obtaining the former resistance value R1 with high accuracy, it is required that the relationship between the ON-resistance value Ron of the ON-resistor element Ron of the first switch SW1 in the conduction (ON) state of the first switch SW1 and the resistance value R1 of the resistor R1 satisfies R1>>Ron.

Further, in order for obtaining the latter combined resistance value (R1+R2) with high accuracy, it is required that the relationship between the combined resistance value (R1+R2) and the OFF-resistance value Roff of the OFF-resistor element Roff of the first switch SW1 satisfies Roff>>R1+R2 (>R1).

In summary of the two relational expressions described above, it is required to satisfy the relationship of Roff>>Ron. The relationship described above can also be obtained with respect to a variable resistor array $R_{VAR}$ shown in FIG. 6 obtained by generalizing the variable resistor array $R_{VAR}$ shown in FIGS. 5A and 5B, namely the variable resistor array $R_{VAR}$ composed of n resistors R1 through Rn and n switches SW1 through SWn.

However, in the related art, there is a problem that a complicated and sophisticated manufacturing process is required for manufacturing an MOS transistor with the ON-resistance value Ron (e.g., several hundreds of ohms) of the ON-resistor element Ron and the OFF-resistance value Roff (e.g., several hundreds of mega ohms) of the OFF-resistor element Roff, and in other words, there is a problem that the MOS transistors described above cannot easily be manufactured.

SUMMARY

An advantage of some aspects of the invention is to solve the problems described above and the invention can be put into practice in the following forms of application.

A variable resistor array according to a first aspect of the invention (1) adapted to make a resistance value between a first terminal and a second terminal variable, includes (2) first through nth resistors (n is an integer equal to or greater than 2, the same applies hereinafter) connected in series, one end of the first resistor being connected to the second terminal, another end of ith one (i is an integer equal to or greater than 1 and equal to or smaller than (n−1), the same applies hereinafter) of the resistors and the one end of (i+1)th one of the resistors being connected to each other, (3) first through nth MOS transistors, ith one of the MOS transistors having a drain connected to a connection point between the ith resistor and the (i+1)th resistor, a source connected to the first terminal, and a gate receiving an input of ith one of first through nth control signals, and nth one of the MOS transistors having a drain connected to the other end of the nth resistor, and (4) first through nth switches, ith one of the switches having one input terminal connected to the source of the ith MOS transistor, another input terminal connected to a predetermined voltage, and an output terminal connected to a back gate of the ith MOS transistor, and connecting either one of the one input terminal and the other input terminal to the output terminal under control of the ith control signal, (5) (5a) in accordance with the ith control signal being at an ON voltage for making the ith MOS transistor conductive, the ith switch connects the other input terminal to the output terminal, thereby applying a voltage of the source to the back gate of the ith MOS transistor, and the ith MOS transistor becomes conductive in response to the ON voltage applied to the gate, and (5b) in accordance with the ith control signal being at an OFF voltage for making the ith MOS transistor cut-off, the ith switch connects the one input terminal to the output terminal, thereby applying a predetermined voltage to the back gate of the ith MOS transistor, and the ith MOS transistor becomes cut-off in response to the OFF voltage applied to the gate.

A variable resistor array according to a second aspect of the invention (1) adapted to make a resistance value between a first terminal and a second terminal variable, includes (2) first through nth resistors (n is an integer equal to or greater than 2, the same applies hereinafter) connected in parallel to each other, one ends of the first through nth resistors being connected to the second terminal, (3) first through nth MOS transistors, ith one (i is an integer equal to or greater than 1 and equal to or smaller than (n−1), the same applies hereinafter) of the MOS transistors having a drain connected to another end of ith one of the resistors, a source connected to the first terminal, and a gate receiving an input of ith one of first through nth control signals, and (4) first through nth switches, ith one of the switches having one input terminal connected to the source of the ith MOS transistor, another input terminal connected to a predetermined voltage, and an output terminal connected to a back gate of the ith MOS transistor, and connecting either one of the one input terminal and the other input terminal to the output terminal under control of the ith control signal, (5) (5a) in accordance with the ith control signal being at an ON voltage for making the ith MOS transistor conductive, the ith switch connects the one input terminal to the output terminal, thereby applying a voltage of the source to the back gate of the ith MOS transistor, and the ith MOS transistor becomes conductive in response to the ON voltage applied to the gate, and (5b) in accordance with the ith control signal being at an OFF voltage for making the ith MOS transistor cut-off, the ith switch connects the other input terminal to the output terminal, thereby applying a predetermined voltage to the back gate of the ith MOS transistor, and the ith MOS transistor becomes cut-off in response to the OFF voltage applied to the gate.

According to the variable resistor array of the first and second aspects of the invention, since the resistance values of the first through nth MOS transistors are reduced due to the fact that the back gate is connected to the source voltage simultaneously as the first through the nth MOS transistors become conductive on the one hand, and the resistance values of the first through nth MOS transistors are increased due to the fact that the back gate is connected to the predetermined voltage simultaneously as the first through the nth MOS transistors become cut-off on the other hand, it becomes possible to define the resistance value with high accuracy similarly to the case of the related art without performing manufacturing through the complicated and sophisticated manufacturing process as in the related art.

An amplifier circuit according to a third aspect of the invention includes the variable resistor array of one of the first and second aspects of the invention, and an amplifier having one of an input terminal and an output terminal connected to the first terminal of the variable resistor array, and the other of the input terminal and the output terminal connected to the second terminal of the variable resistor array.

An electronic apparatus according to a fourth aspect of the invention includes the amplifier circuit according to the third aspect of the invention.

BRIEF DESCRIPTION OF THE DRAWINGS

The invention will now be described with reference to the accompanying drawings, wherein like numbers reference like elements.

DESCRIPTION OF EXEMPLARY EMBODIMENTS

Amplifier circuits of embodiments of the invention will hereinafter be explained with reference to the accompanying drawings.

Figure 1:
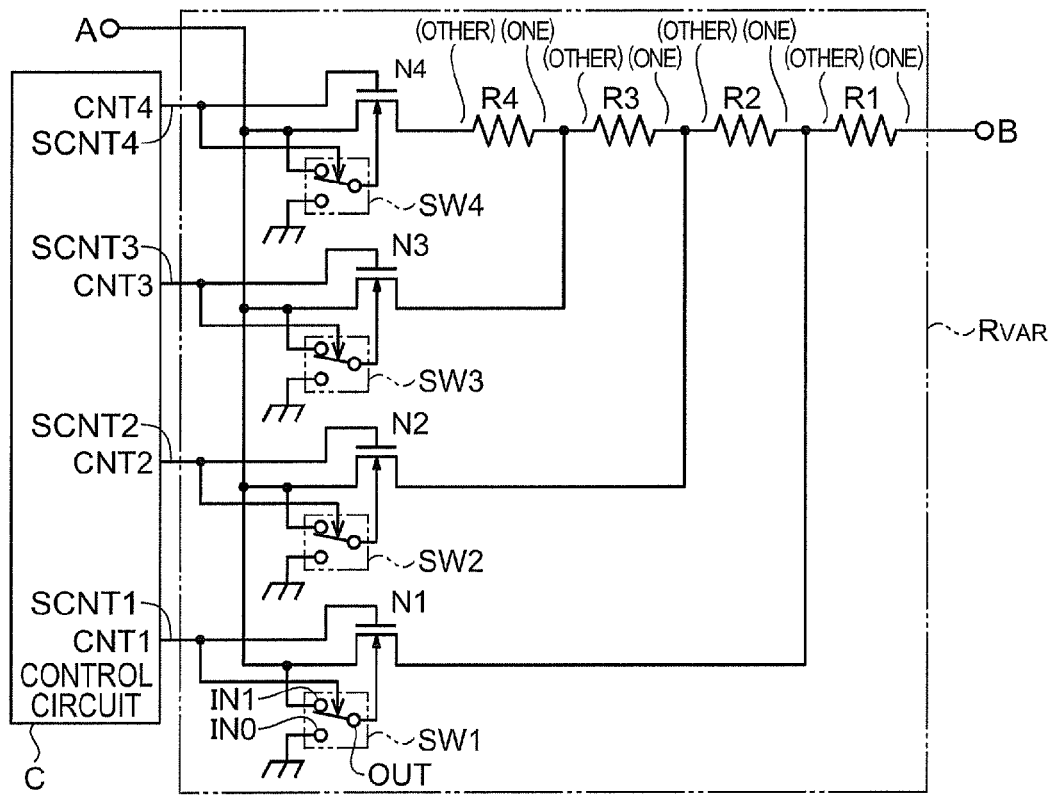
FIG. 1 is a diagram showing a configuration of a variable resistor array of a first embodiment.
Figure 4:
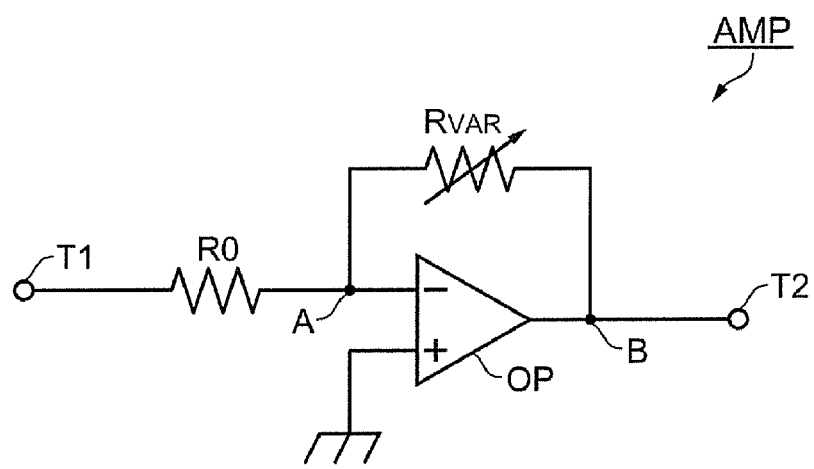
FIG. 4 is a diagram showing a configuration of an amplifier circuit.

FIG. 1 shows a configuration of a variable resistor array of the first embodiment. Further, FIG. 4 shows a configuration of the amplifier circuit of the embodiment including any one of the variable resistor arrays of the first and second embodiments. Prior to the explanation of the variable resistor array, the amplifier circuit will be explained.

First Embodiment

Configuration

As shown in FIG. 4, the amplifier circuit AMP includes an amplifier OP, a resistor R0, and a variable resistor (hereinafter referred to as a "variable resistor array") $R_{VAR}$ in order for amplifying a signal, which is input to an input terminal T1, and then outputting the amplified signal from an output terminal T2 in a basically similar manner to the related art.

The amplifier OP is, for example, an operational amplifier, having a non-inverted input terminal (+) connected to a potential higher than the ground potential, the resistor R0 is connected between an inverted input terminal (−) of the operational amplifier and the input terminal T1, the variable resistor array $R_{VAR}$ is connected between the inverted input terminal (−) and an output terminal of the operational amplifier, and the output terminal of the operational amplifier is connected to the output terminal T2.

Hereinafter, the position of the inverted input terminal (−) of the amplifier OP is referred to as a "point A," and the position of the output terminal of the amplifier OP is referred to as a "point B" for the sake of convenience of explanations. It is assumed that the point A is in a direct-current "voltage higher than the ground potential GND."

Going back to FIG. 1, the variable resistor array $R_{VAR}$ includes four resistors R1 through R4, four switches SW1 through SW4, and four NMOS transistors N1 through N4 (hereinafter abbreviated as "transistors N1 through N4") as shown in FIG. 1 so as to selectively defining a plurality of resistance values under control of a control circuit C. In other words, the variable resistor array $R_{VAR}$ includes four groups, each of which is composed of one resistor (e.g., the resistor R1), one switch (e.g., the switch SW1), and one transistor (e.g., the transistor N1).

The four resistors R1 through R4 are connected in series, and respectively have resistance values R1 through R4. For example, the resistance value R1 is defined as the entire variable resistor array $R_{VAR}$ by selecting only the resistor R1, the combined resistance value (R1+R2) is defined as the entire variable resistor array $R_{VAR}$ by selecting the resistors R1 and R2, and further the combined resistance value (R1+R2+R3+R4) is defined as the entire variable resistor array $R_{VAR}$ by selecting all of the resistors R1 through R4.

In summary, the purpose of the variable resistor array $R_{VAR}$ is to define as a whole either one of "series combined resistance values," namely the resistance values R1, R2, R3, and R4, and the combined resistance values (R1+R2), (R2+R3+R4), and (R1+R2+R3+R4) in accordance with the state of selection of the four resistors R1 through R4.

The four transistors N1 through N4 are used to define whether or not the four resistors R1 through R4 are selected, for example, the transistor N1 comes into the conduction (ON) state to select the resistor R1, and in contrast, the transistor N1 comes into the cut-off (OFF) state not to select the resistor R1. Here, the transistors N1 through N4 are each formed in, for example, a triple well structure so as to make it possible to apply a voltage different from the substrate voltage to a back gate thereof.

Figure 2:
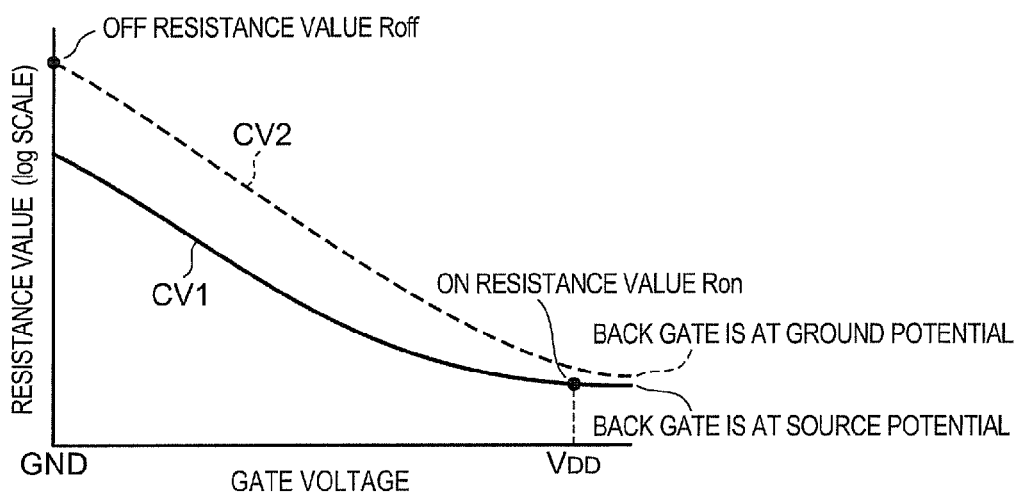
FIG. 2 is a diagram showing operating characteristics of transistors of first and second embodiments.

FIG. 2 shows the relationship between the voltage applied to the back gate of the transistor, the voltage (either one of control signals SCNT1 through SCNT4 output from the control circuit C) applied to the gate of the transistor, and the resistance value of the transistor. When the voltage of the back gate is at the "source voltage," the relationship between the voltage applied to the gate and the resistance value of the transistor becomes as represented by the solid curve CV1.

On the other hand, when the voltage of the back gate of the transistors N1 through N4 is at the "ground potential," the relationship between the amplitude of the voltage applied to the gate and the resistance value of the transistor becomes as represented by the dotted curve CV2.

In the variable resistor array $R_{VAR}$, by applying the "power supply potential $V_{DD}$" (ON voltage) to the gate, it is achieved (1) to make the transistors N1 through N4 conductive (ON), and (2) to set the back gate to be in the "source voltage (voltage higher than the ground potential GND," thereby reducing the resistance value of the transistors N1 through N4 to the ON-resistance value Ron on the curve CV1.

On the other hand, by applying the "ground potential GND" (OFF voltage) to the gate, it is achieved (1) to make the transistors N1 through N4 cut-off (OFF), and (2) to set the back gate to be in the "ground voltage GND," thereby increasing the resistance value of the transistors N1 through N4 to the OFF-resistance value Roff on the curve CV2.

In a more accurate explanation of the "series combined resistance value" described above using the ON-resistance value Ron and the OFF-resistance value Roff, the series combined resistance value in the condition in which the "resistance value R1 of the resistor R1" is to be defined by the variable resistor array $R_{VAR}$ as a whole is obtained as a series combined resistance value of (1) the resistance value R1 of the resistor R1 and (2) a parallel combined resistance value of the ON-resistance value Ron of the transistor N1, the OFF-resistance value Roff of the transistor N2, the OFF-resistance value Roff of the transistor N3, and the OFF-resistance value Roff of the transistor N4.

The four switches SW1 through SW4 are used to define the potential of the back gate of the transistors N1 through N4, respectively, and for example, the switch SW1 connects the back gate of the transistor N1 to the source voltage (the potential at the point A) or the ground potential GND.

The relation of connections between the four resistors R1 through R4, the four transistors N1 through N4, the four switches SW1 through SW4, and control circuit C are as follows.

One end of the resistor R1 is connected to the point B, and the other end of the resistor R1 is connected to one end of the resistor R2 and further to the drain of the transistor N1. The transistor N1 has the gate connected to a control terminal CNT1 of the control circuit C, the source connected to the point A and also to the input terminal IN1 of the switch SW1, and the back gate connected to the output terminal OUT of the switch SW1. The input terminal IN0 of the switch SW1 is connected to the ground potential GND.

The other end of the resistor R2 is connected to one end of the resistor R3, and is also connected to the drain of the transistor N2. The transistor N2 has the gate connected to a control terminal CNT2 of the control circuit C, the source connected to the point A and also to the input terminal IN1 of the switch SW2, and the back gate connected to the output terminal OUT of the switch SW2. The input terminal IN0 of the switch SW2 is connected to the ground potential GND.

The other end of the resistor R3 is connected to one end of the resistor R4, and is also connected to the drain of the transistor N3. The transistor N3 has the gate connected to a control terminal CNT3 of the control circuit C, the source connected to the point A and also to the input terminal IN1 of the switch SW3, and the back gate connected to the output terminal OUT of the switch SW3. The input terminal IN0 of the switch SW3 is connected to the ground potential GND.

The other end of the resistor R4 is connected to the drain of the transistor N4. The transistor N4 has the gate connected to a control terminal CNT4 of the control circuit C, the source connected to the point A and also to the input terminal IN1 of the switch SW4, and the back gate connected to the output terminal OUT of the switch SW4. The input terminal IN0 of the switch SW4 is connected to the ground potential GND.

The control circuit C corresponds to, for example, a CPU and a logic circuit, and outputs the control signal SCNT1 through SCNT4 for simultaneously defining two contents, namely which resistor or resistors among the resistors R1 through R4 should be selected (in other words, which one of the conduction (ON) and cut-off (OFF) states each of the transistors N1 through N4 is switched to), and what connection state of the switches SW1 through SW4 is to be made (which one of the input terminals IN0 and IN1 of each of the switches SW1 through SW4 is to be selected), from the control terminals CNT1 through CNT4.

The control circuit C outputs the following control signal SCNT1 from the control terminal CNT1 with respect to, for example, the switching of the transistor N1 between the conduction (ON) state and the cut-off (OFF) state, and the selection of the input terminals IN0 and IN1 of the switch SW1.

The control circuit C outputs the control signal SCNT1 of "1" (the power supply potential $V_{DD}$), namely the ON voltage, thereby switching the transistor N1 to the conduction (ON) state. At the same time, the input terminal IN1 is made to be connected to the output terminal OUT, thereby connecting the back gate to the "source potential," and as a result, the resistance value of the transistor N1 in the conduction (ON) state is reduced to the ON-resistance value Ron (shown in FIG. 2).

In contrast to the above, the control circuit C outputs the control signal SCNT1 of "0" (the ground potential GND), namely the OFF voltage, thereby switching the transistor N1 to the cut-off (OFF) state. At the same time, the input terminal IN0 is made to be connected to the output terminal OUT, thereby connecting the back gate to the "ground potential GND," and as a result, the resistance value of the transistor N1 in the cut-off (OFF) state is increased to the OFF-resistance value Roff (shown in FIG. 2).

Operations

The operations of the variable resistor array of the first embodiment will be explained. In the following explanations, it is assumed that the variable resistor array $R_{VAR}$ should define the "resistance value R1" as a whole.

The control circuit C outputs the control signal SCNT1 of "1" (the power supply potential $V_{DD}$ as the ON voltage) and the control signals SCNT2 through SCNT4 of "0" (the ground potential GND as the OFF voltage) from the control terminals CNT1 through CNT4. Thus, the transistor N1 is switched to the conduction (ON) state, and at the same time the transistors N2 through N4 are switched to the cut-off (OFF) state. As a result, only the resistor R1 is selected, and consequently, other resistors, the resistors R2 through R4 are not selected.

At the same time, in the switch SW1, the input terminal IN1 is connected to the output terminal OUT, and thus, the back gate of the transistor N1 is connected to the "source potential," and as a result, the resistance value of the transistor N1 described above thus switched to the conduction (ON) state is reduced to the ON-resistance value Ron (shown in FIG. 2).

On the other hand, in the switches SW2 through SW4, the input terminal IN0 is connected to the output terminal OUT, and thus, the back gate of each of the transistors N2 through N4 is connected to the "ground potential GND," and as a result, the resistance values of the transistors N2 through N4 described above thus switched to the cut-off (OFF) state are increased to the OFF-resistance value Roff (shown in FIG. 2).

Advantages

Figure 5A:
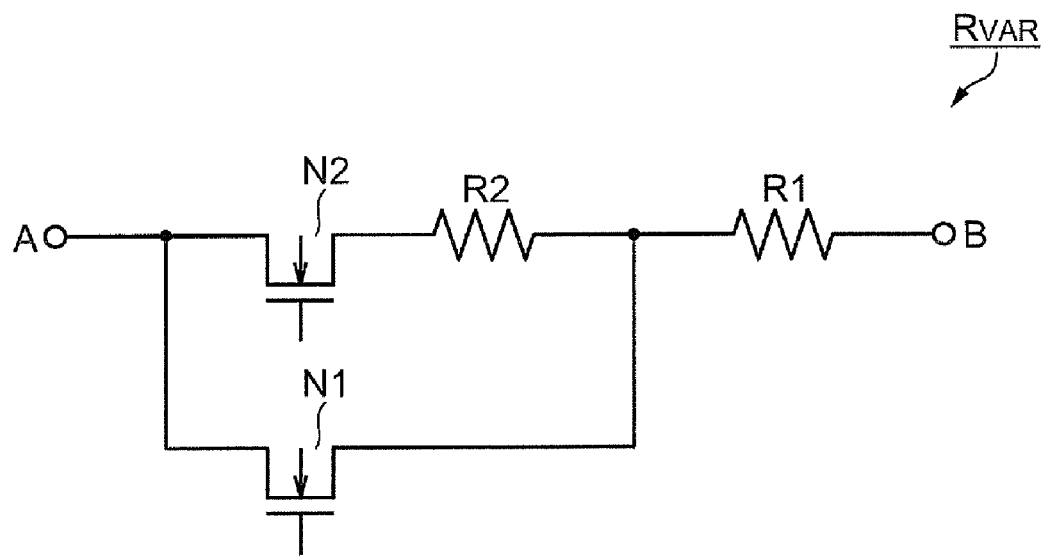
FIGS. 5A and 5B are diagrams showing a configuration of a variable resistor array of the related art.
Figure 5B:
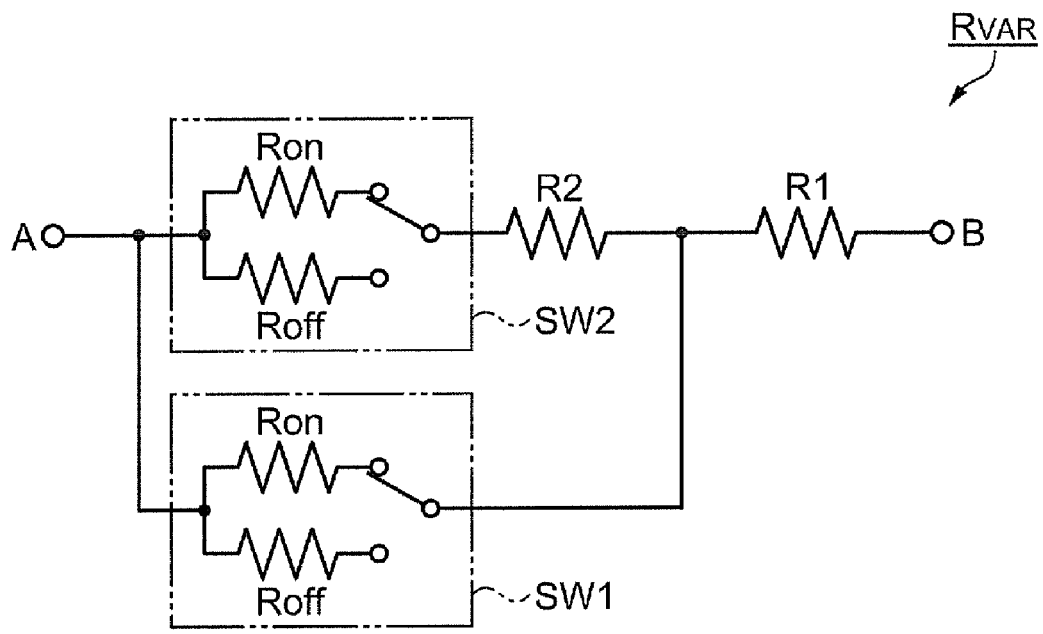
Figure 6:
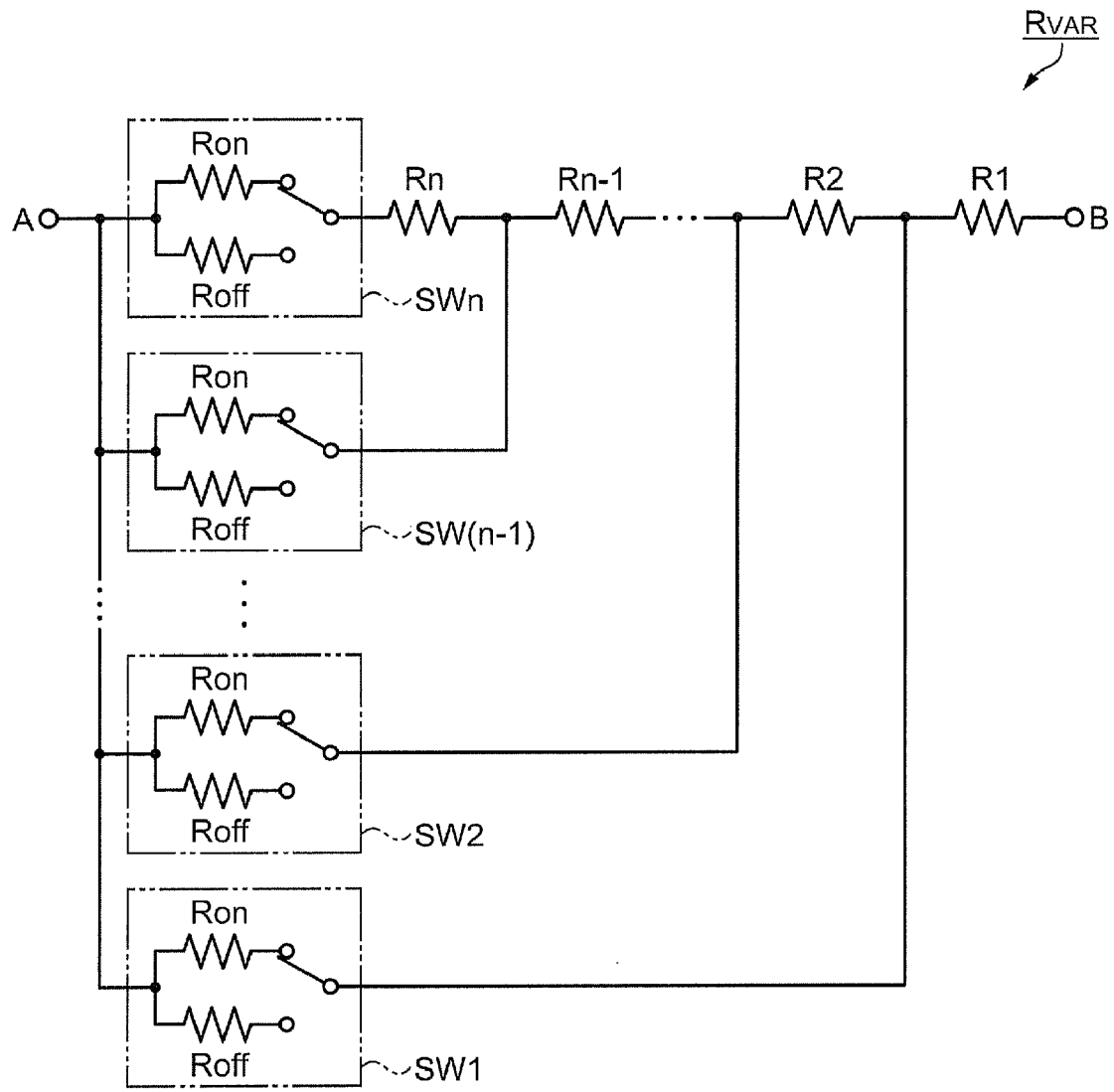
FIG. 6 is a diagram showing an equivalent circuit of the variable resistor array of the related art.

As described above, in the variable resistor array $R_{VAR}$ of the first embodiment, when attempting to define the "resistance value R1" by the variable resistor array $R_{VAR}$ as a whole, the transistor N1 corresponding to the resistor R1 is switched to the conduction (ON) state, thereby selecting the resistor R1, and at the same time the resistance value of the transistor N1 in the conduction (ON) state is reduced to the ON-resistance value Ron due to the fact that the back gate of the transistor N1 is at the "source voltage." In contrast, the transistors N2 through N4 corresponding to the other resistors, the resistors R2 through R4 come into the cut-off (OFF) state, thereby preventing selection of the resistors R2 through R4, and at the same time, the resistance values of the transistors N2 through N4 in the cut-off (OFF) state are increased to the OFF-resistance value Roff due to the fact that the back gate of each of the transistors N2 through N4 is at the "ground potential GND." Thus, it becomes possible to define the "resistance value R1" to be defined by the variable resistor array $R_{VAR}$ as a whole can be defined with high accuracy similarly to the case of the related art without manufacturing the variable resistor array $R_{VAR}$ (shown in FIGS. 5A, 5B, and 6) of the related art through the complicated and sophisticated manufacturing process.

Second Embodiment

Figure 3:
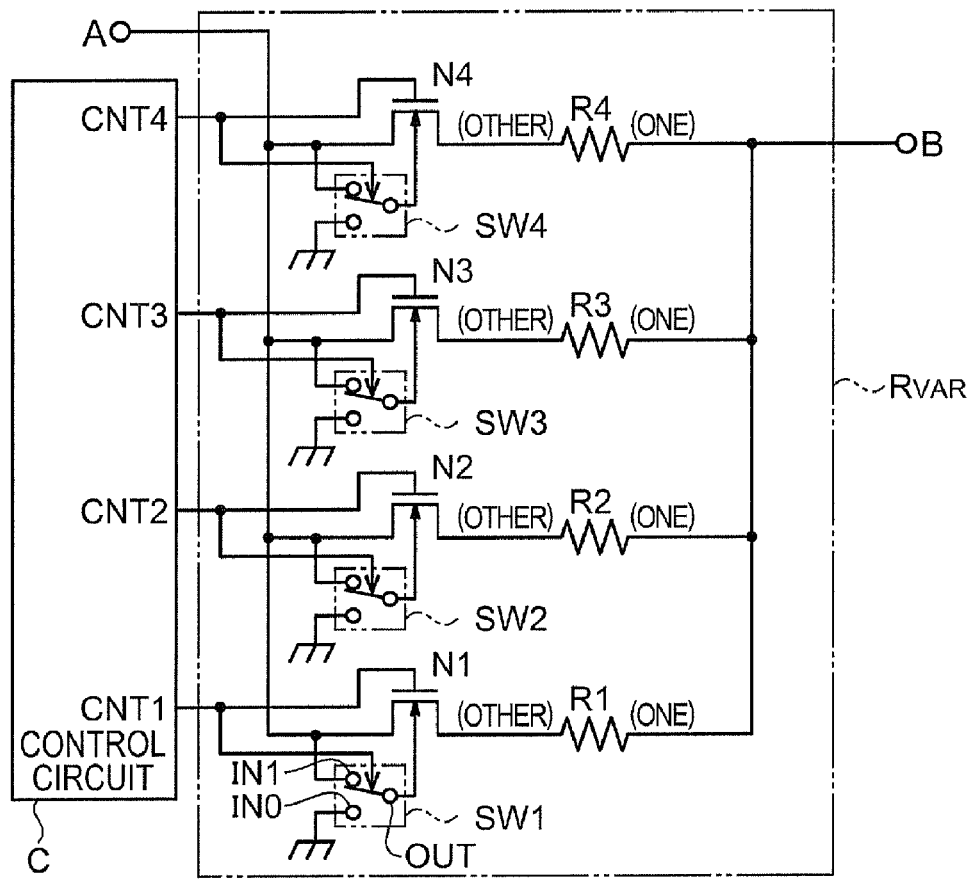
FIG. 3 is a diagram showing a configuration of a variable resistor array of the second embodiment.

FIG. 3 shows a configuration of a variable resistor array of the second embodiment. The variable resistor array $R_{VAR}$ of the second embodiment is disposed between the point A and the point B in the amplifier circuit AMP shown in FIG. 4 similarly to the variable resistor array $R_{VAR}$ of the first embodiment, and includes four resistors R1 through R4, four switches SW1 through SW4, and four transistors N1 through N4 as shown in FIG. 3.

In the variable resistor array $R_{VAR}$ of the second embodiment, in contrast to the variable resistor array $R_{VAR}$ of the first embodiment, the four resistors R1 through R4 are connected in parallel to each other. One ends of the four resistors R1 through R4 are connected to the point B, and the other ends thereof are connected to the drains of the transistors N1 through N4, respectively. The relation of connections between the gates, the back gates, and the sources of the transistors N1 through N4, and the input terminals IN0, the input terminals IN1, and the output terminals OUT is the same as the relation of connections in the first embodiment.

The purpose of the variable resistor array $R_{VAR}$ of the second embodiment is to define as a whole either one of "parallel combined resistance values," namely the resistance values R1, R2, R3, and R4, and the combined resistance values (R1//R2), ..., (R2//R3//R4), and (R1//R2//R3//R4) in accordance with the state of selection of the four resistors R1 through R4. Here, "R1//R2," for example, denotes the combined resistance value of the resistors R1 and R2 connected in parallel to each other.

Operations

The operations of the variable resistor array of the second embodiment will be explained. In the following explanations, it is assumed that the variable resistor array $R_{VAR}$ should define the "resistance value R1" as a whole.

Similarly to the case of the first embodiment, the control circuit C outputs the control signal SCNT1 of "1" (the power supply potential $V_{DD}$ as the ON voltage) and the control signals SCNT2 through SCNT4 of "0" (the ground potential GND as the OFF voltage) from the control terminals CNT1 through CNT4. Thus, the transistor N1 comes into the conduction (ON) state, and at the same time, the transistors N2 through N4 come into the cut-off (OFF) state. As a result, only the resistor R1 is selected, and consequently, other resistors, the resistors R2 through R4 are not selected.

At the same time, similarly to the case of the first embodiment, in the switch SW1, the input terminal IN1 is connected to the output terminal OUT, and thus, the back gate of the transistor N1 is connected to the "source potential," and as a result, the resistance value of the transistor N1 described above thus staying in the conduction (ON) state is reduced to the ON-resistance value Ron (shown in FIG. 2).

On the other hand, in the switches SW2 through SW4, the input terminal IN0 is connected to the output terminal OUT, and thus, the back gate of each of the transistors N2 through N4 is connected to the "ground potential GND," and as a result, the resistance values of the transistors N2 through N4 described above thus staying in the cut-off (OFF) state are increased to the OFF-resistance value Roff (shown in FIG. 2)

Advantages

As described above, in the variable resistor array $R_{VAR}$ of the second embodiment, when attempting to define the "resistance value R1" by the variable resistor array $R_{VAR}$ as a whole, similarly to the first embodiment, the transistor N1 corresponding to the resistor R1 is switched to the conduction (ON) state, thereby selecting the resistor R1, and at the same time the resistance value of the transistor N1 in the conduction (ON) state is reduced to the ON-resistance value Ron due to the fact that the back gate of the transistor N1 is at the "source potential." On the other hand, the transistors N2 through N4 corresponding to the other resistors, the resistors R2 through R4 come into the cut-off (OFF) state, thereby preventing selection of the resistors R2 through R4, and at the same time, the resistance values of the transistors N2 through N4 in the cut-off (OFF) state are increased to the OFF-resistance value Roff due to the fact that the back gate of each of the transistors N2 through N4 is at the "ground potential GND." Thus, similarly to the first embodiment, it becomes possible to define the "resistance value R1" to be defined by the variable resistor array $R_{VAR}$ as a whole can be defined with high accuracy similarly to the case of the related art without manufacturing thereof through the complicated and sophisticated manufacturing process of the related art.

MODIFIED EXAMPLE

The same advantages as described above can be obtained by configuring the variable resistor array of a modified example of the first and second embodiments with n (n is an integer equal to or greater than 2) groups (each composed of the resistor, the switch, and the transistor) instead of four groups described above in the first and second embodiments.

The variable resistor array of the modified example uses PMOS transistors instead of the NMOS transistors described above, and has the input terminals IN0 of the switches SW1 through SW4 connected to the "power supply potential $V_{DD}$," thereby also providing substantially the same advantages as described above.

The entire disclosure of Japanese Patent Application No. 2008-094768 filed on Apr. 1, 2008 is expressly incorporated by reference herein.

What is claimed is:

1. A variable resistor array adapted to make a resistance value between a first terminal and a second terminal variable, the variable resistor array comprising:
(1) first through nth resistors (n is an integer equal to or greater than 2, the same applies hereinafter) connected in series, one end of the first resistor being connected to the second terminal, another end of ith one (i is an integer equal to or greater than 1 and equal to or smaller than (n−1), the same applies hereinafter) of the resistors and the one end of (i+1)th one of the resistors being connected to each other;

(2) first through nth MOS transistors, ith one of the MOS transistors having a drain connected to a connection point between the ith resistor and the (i+1)th resistor, a source connected to the first terminal, and a gate receiving an input of ith one of first through nth control signals, and nth one of the MOS transistors having a drain connected to the other end of the nth resistor; and (3) first through nth switches, ith one of the switches having one input terminal connected to the source of the ith MOS transistor, another input terminal connected to a predetermined voltage, and an output terminal connected to a back gate of the ith MOS transistor, and connecting either one of the one input terminal and the other input terminal to the output terminal under control of the ith control signal, (4) wherein (4a) in accordance with the ith control signal being at an ON voltage for making the ith MOS transistor conductive, the ith switch connects the other input terminal to the output terminal, thereby applying a voltage of the source to the back gate of the ith MOS transistor, and the ith MOS transistor becomes conductive in response to the ON voltage applied to the gate, and (4b) in accordance with the ith control signal being at an OFF voltage for making the ith MOS transistor cut-off, the ith switch connects the one input terminal to the output terminal, thereby applying a predetermined voltage to the back gate of the ith MOS transistor, and the ith MOS transistor becomes cut-off in response to the OFF voltage applied to the gate.

2. A variable resistor array adapted to make a resistance value between a first terminal and a second terminal variable, the variable resistor array comprising:

(1) first through nth resistors (n is an integer equal to or greater than 2, the same applies hereinafter) connected in parallel to each other, one ends of the first through nth resistors being connected to the second terminal;

(2) first through nth MOS transistors, ith one (i is an integer equal to or greater than 1 and equal to or smaller than (n−1), the same applies hereinafter) of the MOS transistors having a drain connected to another end of ith one of the resistors, a source connected to the first terminal, and a gate receiving an input of ith one of first through nth control signals; and (3) first through nth switches, ith one of the switches having one input terminal connected to the source of the ith MOS transistor, another input terminal connected to a predetermined voltage, and an output terminal connected to a back gate of the ith MOS transistor, and connecting either one of the one input terminal and the other input terminal to the output terminal under control of the ith control signal, (4) wherein (4a) in accordance with the ith control signal being at an ON voltage for making the ith MOS transistor conductive, the ith switch connects the one input terminal to the output terminal, thereby applying a voltage of the source to the back gate of the ith MOS transistor, and the ith MOS transistor becomes conductive in response to the ON voltage applied to the gate, and (4b) in accordance with the ith control signal being at an OFF voltage for making the ith MOS transistor cut-off, the ith switch connects the other input terminal to the output terminal, thereby applying a predetermined voltage to the back gate of the ith MOS transistor, and the ith MOS transistor becomes cut-off in response to the OFF voltage applied to the gate.

3. An amplifier circuit comprising:

the variable resistor array according to claim 1; and an amplifier having one of an input terminal and an output terminal connected to the first terminal of the variable resistor array, and the other of the input terminal and the output terminal connected to the second terminal of the variable resistor array.

* * * * *